US010515308B2

(12) United States Patent
Li et al.

(10) Patent No.: US 10,515,308 B2
(45) Date of Patent: Dec. 24, 2019

(54) SYSTEM, METHOD AND CLOUD-BASED PLATFORM FOR PREDICTING ENERGY CONSUMPTION

(71) Applicant: Global Design Corporation Ltd., Wanchai (HK)

(72) Inventors: Yee Shing Li, Hong Kong (HK); Yung Fai Ho, Hong Kong (HK)

(73) Assignee: GLOBAL DESIGN CORPORATION LTD., Wanchai (HK)

( * ) Notice: Subject to any disclaimer, the term of this patent is extended or adjusted under 35 U.S.C. 154(b) by 937 days.

(21) Appl. No.: 14/929,034

(22) Filed: Oct. 30, 2015

(65) Prior Publication Data

US 2017/0124466 A1 May 4, 2017

(51) Int. Cl.
*G06F 15/18* (2006.01)
*G06N 5/04* (2006.01)
(Continued)

(52) U.S. Cl.
CPC ............... *G06N 5/04* (2013.01); *G01R 22/10* (2013.01); *G06N 20/00* (2019.01); *G06Q 10/04* (2013.01);
(Continued)

(58) Field of Classification Search
CPC ....................................................... G06N 15/18
(Continued)

(56) References Cited

U.S. PATENT DOCUMENTS 7,974,913 B1 7/2011 Morozov et al.
9,800,646 B1 10/2017 Stamatakis et al.
(Continued)

FOREIGN PATENT DOCUMENTS

CN 102354178 A 2/2012
CN 102969796 A 3/2013
(Continued)

OTHER PUBLICATIONS

Cleveland, R. B., et al., "STL: A Seasonal-Trend Decomposition Procedure Based on Loess," Journal of Official Statistics, vol. 6, No. 1, Mar. 1990, pp. 1-33.

(Continued)

*Primary Examiner* — David R Vincent
(74) *Attorney, Agent, or Firm* — Slater Matsil, LLP

(57) ABSTRACT

According to one embodiment of the present invention, a prediction system is provided. The system comprises a first data decomposition facility configured to decompose a provided time series of consumption data into a plurality of different training sets for different types of days and a second data decomposition facility configured to decompose each one of the plurality of training sets into at least a seasonal component and a trend component. The system further comprises a regression facility configured to perform a regression analysis on the decomposed consumption data based on at least the trend component and chronological information associated with the consumption data of the respective training set to train a prediction function and a prediction facility configured to estimate predicted energy consumption data based on the trained prediction function and the type of a day for which the prediction is performed.

According to further embodiment, a method for predicting energy consumption data based on a time series of consumption data and a cloud-based prediction platform are disclosed.

20 Claims, 3 Drawing Sheets

(51) Int. Cl.
*G01R 22/10* (2006.01)
*G06N 20/00* (2019.01)
*G06Q 10/06* (2012.01)
*G06Q 50/06* (2012.01)
*G06Q 10/04* (2012.01)

(52) U.S. Cl.
CPC .......... *G06Q 10/06* (2013.01); *G06Q 10/063* (2013.01); *G06Q 50/06* (2013.01); *Y02P 90/82* (2015.11)

(58) Field of Classification Search
USPC .................................................. 706/15, 45
See application file for complete search history.

(56) References Cited

U.S. PATENT DOCUMENTS

| | | | |
|---|---|---|---|
| 2003/0101009 A1 | 5/2003 | Seem | |
| 2004/0102937 A1* | 5/2004 | Ibrahim | G05B 13/048 703/2 |
| 2005/0090995 A1* | 4/2005 | Sonderegger | H02J 3/00 702/57 |
| 2005/0171645 A1 | 8/2005 | Oswald et al. | |
| 2008/0109387 A1 | 5/2008 | Deaver et al. | |
| 2009/0157573 A1* | 6/2009 | Anderson | G06N 99/005 706/12 |
| 2010/0030617 A1 | 2/2010 | Handley | |
| 2010/0274602 A1 | 10/2010 | Kaufman et al. | |
| 2011/0040785 A1 | 2/2011 | Steenberg et al. | |
| 2012/0143383 A1 | 6/2012 | Cooperrider et al. | |
| 2012/0158631 A1 | 6/2012 | Pitcher et al. | |
| 2012/0259583 A1 | 10/2012 | Noboa et al. | |
| 2012/0316693 A1 | 12/2012 | Ogawa et al. | |
| 2013/0066479 A1 | 3/2013 | Shetty et al. | |
| 2013/0262197 A1 | 10/2013 | Kaulgud et al. | |
| 2014/0058572 A1 | 2/2014 | Stein et al. | |
| 2014/0062707 A1 | 3/2014 | Hong et al. | |
| 2014/0074311 A1 | 3/2014 | Kearns et al. | |
| 2014/0200763 A1 | 7/2014 | Sisk | |
| 2014/0222394 A1 | 8/2014 | Drees et al. | |
| 2015/0100167 A1 | 4/2015 | Sloo et al. | |
| 2015/0178633 A1 | 6/2015 | ElBsat et al. | |
| 2015/0178865 A1* | 6/2015 | Anderson | G05B 17/02 705/7.25 |
| 2015/0256401 A1 | 9/2015 | Zinger et al. | |
| 2015/0261963 A1 | 9/2015 | Ukil et al. | |
| 2016/0055419 A1* | 2/2016 | Fischer | G06N 5/048 706/12 |
| 2016/0187449 A1 | 6/2016 | Beiner et al. | |
| 2016/0370830 A1 | 12/2016 | Miller | |
| 2017/0090004 A1 | 3/2017 | Marshall et al. | |

FOREIGN PATENT DOCUMENTS

| | | |
|---|---|---|
| CN | 103018582 A | 4/2013 |
| CN | 103236102 A | 8/2013 |
| CN | 103543309 A | 1/2014 |
| CN | 103676819 A | 3/2014 |
| CN | 104239982 A | 12/2014 |
| CN | 104615119 A | 5/2015 |
| KR | 20100125809 A | 12/2010 |
| KR | 101321622 B1 | 10/2013 |
| KR | 101336571 B1 | 12/2013 |

OTHER PUBLICATIONS

Grubbs, F. E., "Procedures for Detecting Outlying Observations in Samples," Technometrics, vol. 11, No. 1, Feb. 1969, pp. 1-22.
Hoerl, A. E., et al., "Ridge Regression: Biased Estimation for Nonorthogonal Problems," Technometrics, vol. 12, No. 1, Feb. 1970, pp. 55-67.
Rosner, B., "Percentage Points for a Generalized ESD Many-Outlier Procedure," Technometrics, vol. 25, No. 2, May 1983, pp. 165-172.

* cited by examiner

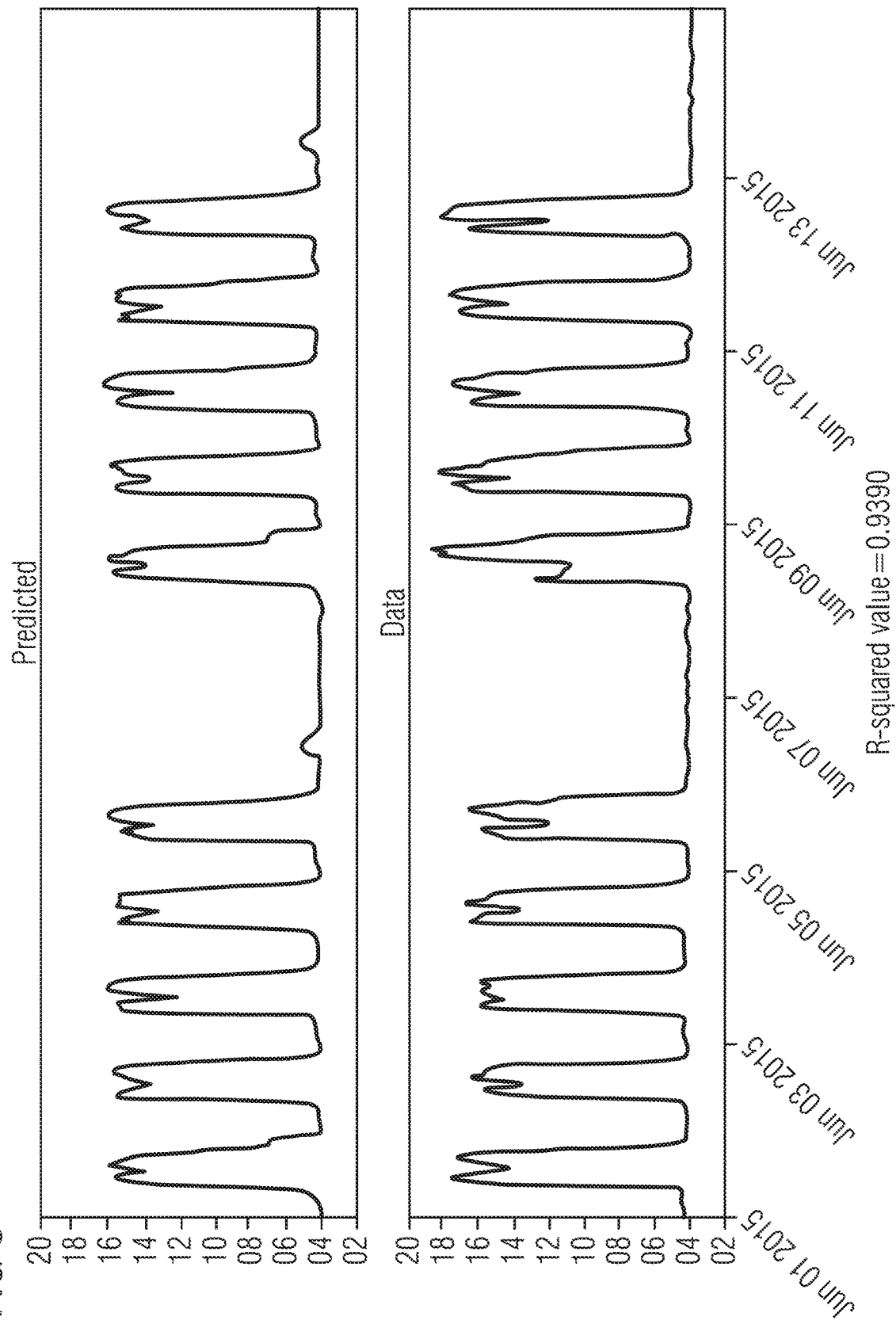

SYSTEM, METHOD AND CLOUD-BASED PLATFORM FOR PREDICTING ENERGY CONSUMPTION

TECHNICAL FIELD

The present invention relates to predicting energy consumption. In particular, the present invention relates to system, method and cloud-based platform for predicting energy consumption.

BACKGROUND

With the prospect of global climate change, energy consumption and corresponding carbon dioxide emission are of particular importance in all areas of technology. A relatively large proportion of primary energy is used for the operation of residential, commercial and industrial buildings, for example for lighting and heating, ventilation and air conditioning (HVAC). It is widely recognized that energy consumption in this area is one of the biggest carbon dioxide emission driver nowadays. In order to reduce carbon dioxide emissions worldwide, apart from utilizing more clean energy sources, energy efficiency in the building sector is thus one of the best opportunities to address the problems of global climate change. This is particularly true in view of growing populations, the widespread use of electricity driven technologies and an increase in the amount of manmade buildings on the planet.

One precondition for achieving high energy efficiency is an in-depth understanding and prediction of energy consumption. In the prior art, some approaches for predicting an energy consumption of a given appliance or site exists. Such approaches are based on analyzing historical consumption data of utility meters by applying a predictive algorithm, for example based on statistical data regression or neural networks. However, based on relatively limited data sets, for example a monthly total energy consumption of a building, and very complex energy consumption patterns based on a plurality of input parameters, such methods often do not provide sufficiently precise prediction results or require very long training times. Moreover, such methods are often based on a retrospective analysis of monthly consumption data and therefore do not allow an owner or operator of a building to assess the energy efficiency of one or several buildings in real-time.

Accordingly, there is a need for better systems and methods for predicting an energy consumption of one or more buildings. Preferably, such improved systems and methods should allow a site manager or owner to monitor and compare a predicted energy consumption with a true energy consumption of the building in real-time.

SUMMARY

According to a first aspect of the present invention, a prediction system is disclosed. The prediction system comprises a measurement system for providing a time series of granular-level consumption data and a first data decomposition facility configure to decompose the time series of granular-level consumption data into a plurality of different training sets for different types of days and a second decomposition facility configured to decompose each one of the plurality of training sets into a seasonal component and a trend component. The prediction system further comprises a regression facility configure to perform a regression analysis on the decomposed consumption data based on the trend component and chronological information associated with the consumption data of the respective training set to train a prediction function. The prediction system further comprises a prediction facility configure to estimate predicted energy consumption data based on the trained prediction function and a type of day for which the prediction is performed.

According to a second aspect of the present invention, a method for predicting energy consumption data comprises capturing consumption data of energy consumed using a measurement system. The energy consumption data comprises a time series of granular-level consumption data. The method further comprises decomposing the consumption data into a plurality of different training sets for different types of days, training a prediction function independently for each type of day based on the plurality of training sets, and estimating predicted energy consumption data based on the training prediction function and a type of the day for which the prediction is performed.

According to a third aspect of the present invention, a cloud-based prediction platform is disclosed. The cloud-based prediction platform comprises a measurement system comprising a plurality of sensors configured to measure a time series of granular-level consumption data. The cloud-based prediction platform further comprises a data capture module configured to capture the time series of consumption data provided over a data network, a first data decomposition module configured to decompose the consumption data into a plurality of different training sets for different types of days, and a second data decomposition module configured to decompose each one of the plurality of training sets into at least a seasonal component and trend component. The prediction platform further comprises a regression module configured to perform a regression analysis on the decomposed consumption data based on at least the trend component and chronological information associated with the consumption data of the respective training set to train a prediction function, a prediction module configure to estimate predicted energy consumption data based on the trained prediction function and a type of the day for which the prediction is performed, and an output module configure to output the estimated predicted energy consumption data to at least one of a user interface, an alerting facility, a storage facility or a third party interface. The data capture module, the first data decomposition module, the second data decomposition module, the regression module, and the prediction module may be stored in a non-transitory storage medium to be executed in a processor.

By using granular-level consumption data decomposed into different training sets and components, a more precise prediction of energy consumption data can be achieved using data from a relatively short training period. Moreover, with this approach relatively fine-grained, granular-level prediction data may be estimated, which may be used for live monitoring or alerting in order to quickly detect trends or deviations in a resource consumption of a monitored site.

BRIEF DESCRIPTION OF THE DRAWINGS

Various embodiments of the present invention will be described below with reference to the attached drawings. In the drawings, like reference symbols are used for like elements of different embodiments.

FIG. 3 shows a comparison of predicted energy consumption data and measured energy consumption data of a test site.

DETAILED DESCRIPTION OF ILLUSTRATIVE EMBODIMENTS

Embodiments of the present invention relate to a prediction system for estimating predicted energy consumption data based on a trained prediction function for at least one monitored site such as a building. Embodiments of the present invention further relate to a method for predicting energy consumption data and a cloud-based prediction platform, which can be used to implement such a prediction system.

Figure 1:
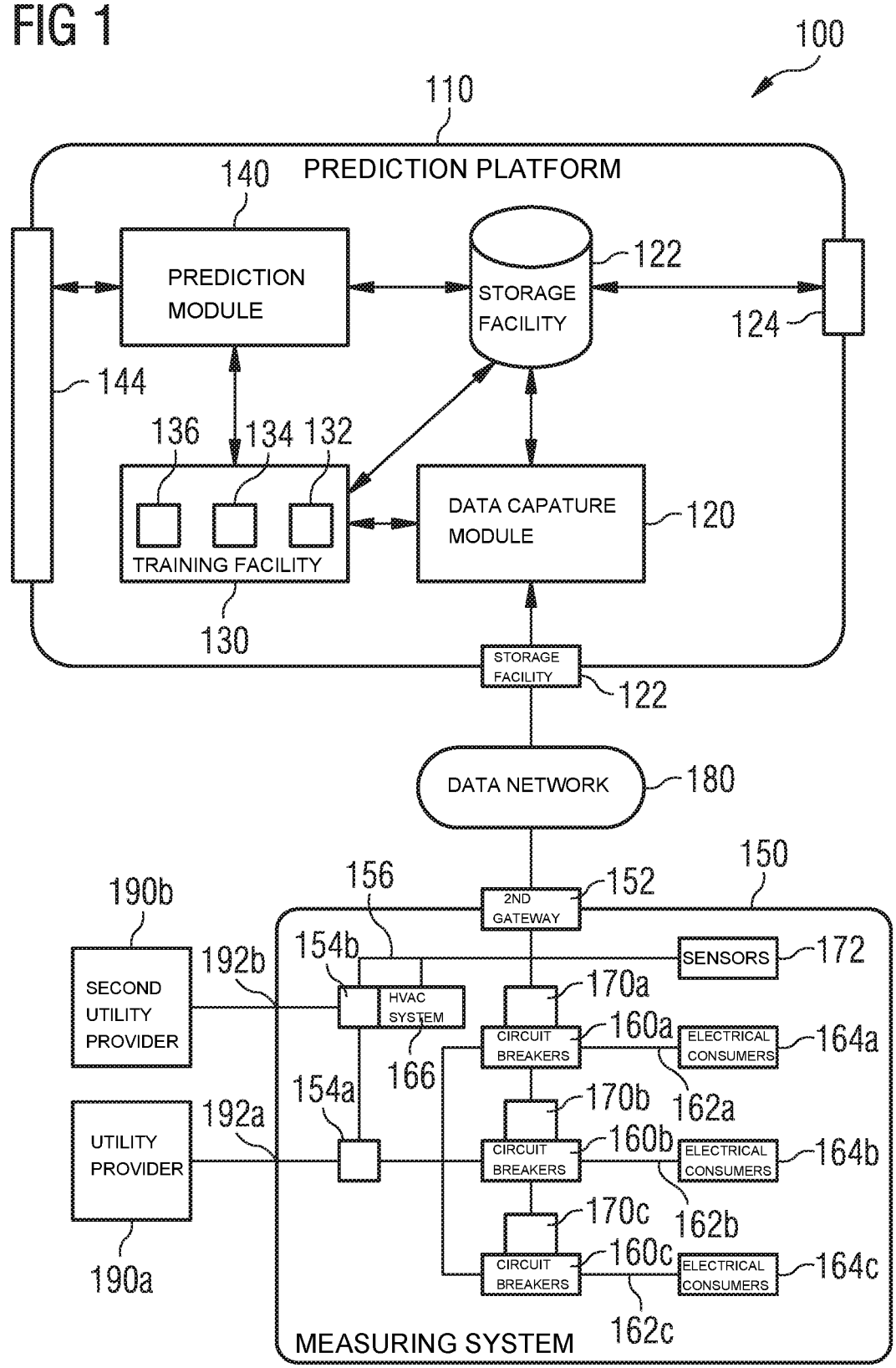
FIG. 1 shows a schematic diagram of a prediction system in accordance with an embodiment of the invention.

FIG. 1 shows a prediction system 100 according to an embodiment of the invention. The system 100 comprises a prediction platform 110 and a measuring system 150 connected thereto via a first gateway 112 and a second gateway 152 of a data network 180 such as the Internet.

The measuring system 150 is deployed at a site to be monitored, for example a single building or a group of buildings. In case multiple buildings are to be monitored, each building may have its own measuring system 150. In the depicted example, the site is supplied with electrical energy by a utility provider 190a at a central electricity supply point 192a. For example, the site may be connected to an energy distribution network of the utility provider 190a by a smart meter device 154a. Moreover, the site is supplied with gas by a second utility provider 190b at a central gas supply point 192b, metered by a gas metering device 154b. However, in an alternative embodiment, energy may be provided by fewer or more providers, through fewer or more supply points and/or by fewer or more energy carriers to the monitored site.

Within the monitored site, the electrical energy supplied by the utility provider 190a is distributed by a number of distribution panels (not shown). Typically, the electrical energy provided to any specific end-point within the site to be monitored is provided via at least one distribution panel and protected by at least one circuit-breaker. In the example embodiment shown in FIG. 1, only three circuit-breakers 160a to 160c are shown for reasons of simplicity. However, attention is drawn to the fact that the monitored site may contains tens, hundreds or even thousands of distribution panels and circuit-breakers.

In the described embodiment, each of the circuit-breakers 160a to 160c has a corresponding sensor 170a to 170c assigned to it. The sensors 170 are placed on the circuit-breakers 160 in order to monitor the energy consumption of corresponding circuits 162a to 162c leading to electrical consumers 164a to 164c, respectively. In a different embodiment, the sensors 170 may be associated with individual appliances, groups of circuit-breakers, distribution panels or any other distinct part of the energy distribution network within the site to be monitored.

The measuring system 150 further comprises a heating, ventilation and air conditioning (HVAC) system 166, which is supplied with energy in the form of gas by the gas metering device 154b. Typically, the HVAC system 166 will comprise one or more internal sensors or control devices, which provide information about the energy used by the HVAC system 166 as well as its distribution throughout the monitored site such as a building.

The sensors 170 associated with the circuit breakers 160 as well as the internal sensors of appliances 146 and meters 154 are respectively referred to as granular-level sensors. Moreover, the data they collect is referred to as granular-level energy consumption values in the following.

Moreover, the measuring system 150 comprises an additional sensor 172 for obtaining further status information about the monitored site. In the described embodiment, the sensor 172 measures environmental data, such as a temperature, humidity wind speed, or a level of UV radiation at one or several locations of the monitored site. The environmental data obtained by the sensor 172 may be used to regulate the HVAC system 166, monitoring the current state of the building and predicting a current energy consumption of the monitored site as described below.

The HVAC system 166, the sensors 170 and 172 and optionally the metering devices 154a and 154b are connected by a local area network 156. In this way, location-specific energy consumption values for the individual energy consumers 164 and 166 collected at granular-level as well as further measurement values such as environmental data can be gathered and provided via the gateway 152, the data network 180 and the gateway 112 to the prediction platform 110.

Attention is drawn to the fact that the present invention is not restricted to the specific measuring system 150 disclosed in FIG. 1. For the purpose of the present invention, it is sufficient to provide relatively fine-grained granular-level consumption data for further analysis as detailed below. Such data may also be obtained by advanced data analysis of data provided by one or a few sensors associated with larger parts of a monitored site, rather than by a large number of sensors associated with individual circuits or energy consuming devices.

The prediction platform 110 comprises a data capture module 120, a training facility 130, and a prediction module 140. Furthermore, the prediction platform 110 comprises a storage facility 122, a storage interface 124 and a user interface 144. As described in more detail below, all data processed by the prediction platform 110 is stored in the central storage facility 122. However, attention is drawn to the fact that the inventive method and system may also operate on available data on-the-fly, with storage only provided for archiving purposes or by an external entity. These modules may be implemented in hardware or software or a combination thereof. For example, the individual modules may take the form of computer code stored on a non-transitory storage device for execution by a general purpose processing device, such as a processor of a web-server computer.

In operation, the data capture module 120 obtains granular-level consumption data from the measurement system 150 and stores it in the storage facility 122. Such data may be used as a training set for the training facility 130 as described later. Alternatively, training data obtained by other means may be provided to the storage facility through the storage interface 124. In either case, the data obtained by the data capture module 120 may be used for live monitoring.

Before an energy consumption of a site to be monitored can be reliably predicted, the training facility 130 needs to perform a training based on a relatively large data set. For example, the training facility 130 may be trained based on granular-level consumption data obtained during a training period of a couple of month. As a result, the training facility 130 generates a number of parameters of a model characterizing the site to be monitored. These parameters are also stored in the storage facility 122 and may then be used by the prediction module 140 to estimate energy consumption data on a granular-level for the site to be monitored.

The granular-level consumption data predicted by the prediction module 140 may then be compared with previously stored or live consumption data obtained from the measuring system 150 in order to assess the quality of the prediction module and/or in order to assess the energy efficiency of the site to be monitored. Such an assessment may be performed interactively by means of the user interface 144, for example by allowing an administrator of the monitored site to log into a corresponding web application. Alternatively, automated messages drawing attention to a particularly high or low energy consumption may be send by means of automated messaging systems, such as e-mail or text messages.

For achieving the desired precision of the predicted energy consumption, the training facility 130 decomposes training data stored in the storage facility 122 using a hybrid decomposition model. In the given example, this is performed by means of a horizontal data decomposition module 132 and a vertical decomposition module 134. The horizontal data decomposition module 132 decomposes the training data into a plurality of different training sets for different types of days. For example, the training data may be separated into training data for weekdays, weekend days and holidays. By means of the vertical data decomposition module 134, these different training sets are then further decomposed into a seasonal component, a trend component and a residual component as described in more detail below. Moreover, a regression module 136 may be used to obtain modeling parameters from the trend component provided by the vertical data decomposition module 134. The decomposition of the data into different dimensions by the data decomposition modules 132 and 134 improves the quality of the regression performed by the regression module 136 and hence to quality of the prediction model used by the prediction module 140.

Figure 2:
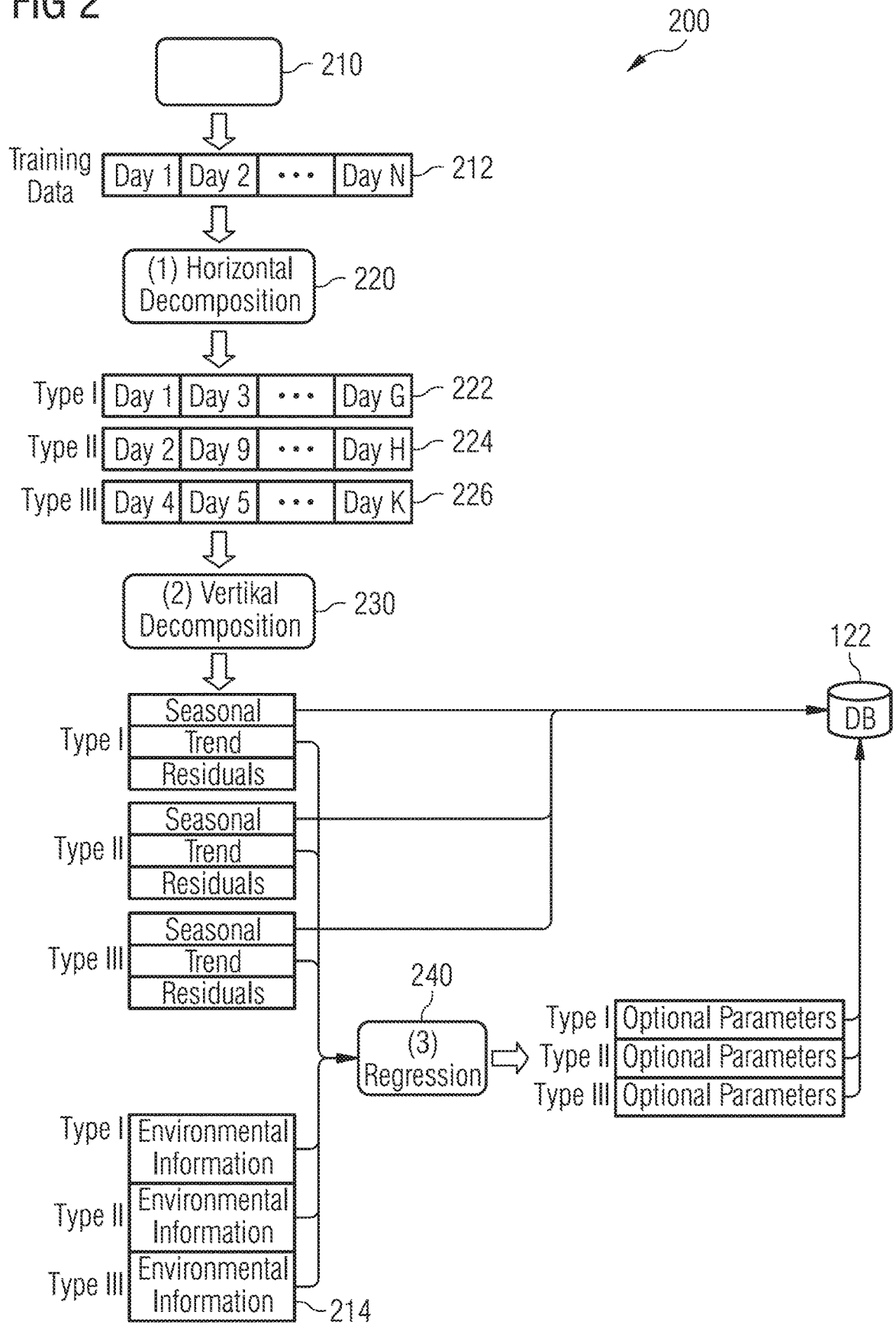
FIG. 2 shows a flow chart of a method for training a prediction function in accordance with an embodiment of the invention.

FIG. 2 shows a flow chart of a method 200 for training a prediction model used for predicting energy consumption data in accordance with an embodiment of the present invention.

When successfully trained, the consumption prediction model models the consumption pattern of a particular data point of a site to be monitored, i.e. a granular-level energy consumption by an individual appliance, such as a HVAC or lighting system, or part of the building, such as a particular room or floor level. In this way, not only the total energy consumption of a building can be predicted and monitored, but also the energy consumption and thus the efficiency of various parts of a building can be analyzed.

The training method 200 shown in FIG. 2 consists of three major phases, a horizontal decomposition, a vertical decomposition and a regression analysis.

In first step 210 of the method 200, training data comprising a time series of consumption data 212 is provided. For example, historic consumption values for each day of a year and for each sensor of a measuring system 150 may be provided, together with associated date information, e.g. a point or period in time at which the consumption values were measured. If possible, the provided training data comprises not only historical consumption values but also associated historical environmental information 214, such as a temperature, a humidity level, a wind strength and an UV radiation level at a time the measurement was taken.

Based on the provided historical consumption data 212, in a step 220, a horizontal decomposition is performed. Accordingly, the horizontal decomposition module 132 may separate the provided consumption data 212 into several training sets 222, 224 and 226 corresponding to different subsets of the consumption data 212. The training sets 222, 224 and 226 are defined based on a type of a corresponding day, for which the measurement data was taken. This horizontal decomposition enables the prediction model to handle behavior changes typically associated with cultural traditions, such as holidays and weekends.

The decomposition of step 220 may be performed based on fix rules, for example calendar rules, in order to decompose the training data 212 into the plurality of different training sets 222, 224 and 226. For example, a first training set 222 for data obtained on normal working days, a second training set 224 for weekend days and a third training set 226 for holidays may be generated in step 220. Alternatively, the classification performed in step 222 may be determined automatically based on machine learning by identifying days with similar consumption patterns. Such an approach is sometimes also referred to as clustering. Either way, the consumption data comprised in the obtained training sets 222, 224 and 226 will be stored in chronological order or annotated with corresponding chronological information for further processing.

In a step 230, each one of the training sets 222, 224 and 226 generated in the horizontal decomposition stage will be further processed by the vertical decomposition module 134. The aim of the vertical decomposition is to separate a time sequence Y corresponding to consumption data of a given training set 222, 224 or 226 into three components, namely a seasonal component S, a trend component T and residuals R, i.e.:

$$Y = S + T + R$$

The seasonal component S models seasonal effects, i.e. periodical patterns. The effect of weather and other environmental factors is modelled by the regression of the trend component T as detailed below.

Decomposing the plurality of different training sets 222, 224 and 226 into a seasonal component S and a trend component T may be performed using known seasonal decomposition algorithms. One instance of such a seasonal decomposition algorithm is the well-known seasonal trend decomposition procedure based on loess. This approach is described in more detail in Robert B. Cleveland, et al., "A seasonal-trend decomposition procedure based on Loess", Journal of Official Statistics, volume 6, issue 1, pages 3 to 73, 1990. Another algorithm that is capable of performing a seasonal decomposition is based on the computation of a moving average as described, for example, in F. E. Grubbs (1969), Procedures for detecting outlying observations in samples, Technometrics, volume 11, issue 1, pages 1 to 21.

Once both the horizontal and vertical decomposition are performed, the seasonal component S is stored in the storage facility 122 and the trend component T is passed onto the regression module 136 for further modeling. The residuals R essentially correspond to an error between the actual measurement data and the components of the consumption data modelled by the seasonal component S and the trend component T and therefore is not further considered in the following. However, the residual component R may still be useful for performing other analytical processes and may therefore also be stored in the storage facility 122.

In step 240, a regression analysis with respect to the trend component T is performed by the regression module 136. This module models the trend component with the aid of chronological information, for example, days, months, years or days of the week. Moreover, in the described embodiment, additional environmental information 214 are used for the modeling as far is they are available for the consumption data for the training sets 222, 224 and 226. For example, temperature data, humidity data, wind speed data and UV level data may be used in order to model the dependency of the energy consumption of a site on the prevailing whether conditions at the time the measurement was taken.

Based on the previously described decomposition of data, this problem can be addressed with many different regression algorithms, for example the so called ridge regression known in the art of statistics. Such methods are described, for example, in A. E. Hoerl & R. W. Kennard (1970). Ridge regression: Biased estimation for nonorthogonal problems. Technometrics, volume 12, issue 1, 55-67, and are therefore not described in further detail here.

Below, a simplified example is provided to show how the regression can be performed in step 240 based on a trend regression part T provided by the second decomposition module 134 in step 230.

In the example, the following trend series Trend_t is given:

| t | 0:00 | 1:00 | 2:00 | 3:00 | 4:00 | 5:00 | 6:00 | 7:00 | 8:00 | 9:00 |
|---|---|---|---|---|---|---|---|---|---|---|
| Trend_t | 61.54523352 | 58.82718 | 51.03212 | 54.55378 | 45.0769 | 50.2287 | 44.1379 | 48.8323 | 56.71133 | 53.6961 |

| 10:00 | 11:00 | 12:00 | 13:00 | 14:00 | 15:00 | 16:00 | 17:00 | 18:00 | 19:00 | 20:00 |
|---|---|---|---|---|---|---|---|---|---|---|
| 65.37566 | 69.12211 | 66.42504 | 66.16551 | 68.11477 | 69.55526 | 62.70756 | 59.5972 | 60.90402 | 63.89067 | 58.51414 |

| 21:00 | 22:00 | 23:00 |
|---|---|---|
| 61.03257 | 54.67184 | 56.18118 |

This trend series is correlated with the following environment information also provided:

| t | 0:00 | 1:00 | 2:00 | 3:00 | 4:00 | 5:00 | 6:00 | 7:00 | 8:00 | 9:00 |
|---|---|---|---|---|---|---|---|---|---|---|
| Temp. | 86 | 85 | 84 | 83 | 82 | 81 | 80 | 80 | 82 | 83 |
| Humidity | 0.72 | 0.80 | 0.82 | 0.73 | 0.76 | 0.77 | 0.80 | 0.80 | 0.77 | 0.75 |
| Wind (mph) | 10 | 9 | 5 | 4 | 2 | 2 | 2 | 2 | 4 | 6 |
| UV Index | 0 | 0 | 0 | 0 | 0 | 0 | 0 | 0 | 1 | 3 |

| 10:00 | 11:00 | 12:00 | 13:00 | 14:00 | 15:00 | 16:00 | 17:00 | 18:00 | 19:00 | 20:00 |
|---|---|---|---|---|---|---|---|---|---|---|
| 87 | 89 | 92 | 95 | 96 | 98 | 91 | 90 | 90 | 90 | 88 |
| 0.67 | 0.62 | 0.52 | 0.46 | 0.42 | 0.38 | 0.58 | 0.57 | 0.58 | 0.57 | 0.61 |
| 6 | 7 | 7 | 6 | 6 | 7 | 8 | 7 | 8 | 8 | 8 |
| 5 | 6 | 8 | 8 | 8 | 7 | 5 | 3 | 1 | 0 | 0 |

| 21:00 | 22:00 | 23:00 |
|---|---|---|
| 86 | 85 | 84 |
| 0.66 | 0.70 | 0.73 |
| 8 | 8 | 7 |
| 0 | 0 | 0 |

Note that in general, temperature, humidity, wind speed and UV index are not the only features taken into account. This is merely a small subset for illustration.

$\theta_t$ is a feature vector at time t, for instance, without considering any feature transform:

$$\theta_{00.00} = \begin{bmatrix} 86 \\ 0.72 \\ 10 \\ 0 \end{bmatrix}$$

Optimal parameters $\beta^*$ can be obtained by performing a regression on the vector Trend_t based on the matrix $\theta$ where $$\theta = [\theta_{00.00} \cdots \theta_{23.00}]$$

For simplification here a method of ordinary least square (OLS) is chosen for regression. In this context, $$\beta^* = \begin{bmatrix} 0.00973 \\ -14.7 \\ 1.524 \\ 1.056 \\ 55.68 \end{bmatrix}$$

In this representation, the last entry of $\beta^*$ is the bias term, which is used to provide a higher degree of freedom to the model.

Moreover, although not used in the described example, further parameters may be utilized as part of the feature vector $\theta$. For example, the set of features of day t may comprise at least one of a heating degree day (HDD) parameter and a cooling degree day (CDD) parameter for day t. As in the described example, a relatively short period is modelled on a daily basis, the value of HDD and CDD will be constant and will be absorbed in the bias term during regression. However, when modelling longer periods of time, these parameters may be expressed explicitly in the model.

As the result of step 240, a number of optimal parameters $\beta$ are determined by the regression module 136. For example, different optimal parameters $\beta$ may be determined for each type of the day and may be stored in the storage facility 122. Together, the seasonal component S determined by the vertical data decomposition module 134 and the optimal parameters $\beta$ determined by the regression module 136 represent a model f(t) for estimating the energy consumption of a site to be monitored for each type of day.

Said model can be used in order to determine the energy consumption of various parts of a building based on the type of a day for which the estimation is performed as well as environmental information 214 such as weather data. Such weather data may either be measured by the measurement system 150 or may be based on weather predictions.

Prediction of the sites energy consumption using the above model is done on a day-by-day basis. Before performing prediction, one has to classify the date for which the prediction is performed according to the same classification rules as used in the horizontal data decomposition in step 220. Given the day type i one can utilize the obtained model to perform prediction based on the following prediction function:

$$\hat{Y} = S_i + f(\theta, \beta_i)$$

Therein, $S_i$ is the seasonal component of type i, $\theta$ are the input parameters defined by the regression module 136, which may consist of both chronological information and environmental information, $\beta_i$ are the optimal parameters of type i and f is the model utilized in the regression module 136.

As result of step 240, the prediction module 140 determines as set of granular-level energy consumption levels for the site to be monitored. Such estimated consumption data may either be used to predict the total energy consumption of a monitored site, for example by adding up all the individual consumption values, or may be used to compare the live energy consumption of various parts of a building with corresponding estimates. Accordingly, an administrator of a building can readily recognize if the entire building or a particular part of it exceeds a predicted energy budget and act accordingly.

FIG. 3 shows a comparison of predicted energy consumption data (top part of the diagram) and actually measured, true energy consumption data (lower part of the diagram) of a test site. For the comparison, granular-level consumption data of the test site was captured between May 1, 2015 and Jun. 14, 2015. Based on the data taken in May 2015, the prediction function was trained. Based on this training, the energy consumption of the test site for the period of Jun. 1, 2015 to Jun. 14, 2015 was estimated and compared with the measure energy consumption for the same period. As can be seen in FIG. 3, a high correlation with $R^2 = 0.9390$ exists even for this relatively short training period.

For the prediction shown in FIG. 3, no environmental data was available for training. That is, the prediction is based merely on the historical trend derived from the training data.

As detailed above, the data used for training by the training facility 130 has essentially the same format as the measurement data obtained from the measurement system 150. Accordingly, the system can be continuously retrained during operation. As a result, the model can be continuously improved in order to obtain more precise estimation results.

By comparing estimated energy consumption values with energy consumption values measured in real-time or with historical energy consumption data 212 provided as a training set, a site administrator or energy advisor can assess the efficiency of the monitored site. Accordingly, means of improving the energy efficiency of the site can be devised and monitored.

For example, a site administrator may compare the energy efficiency of a building before and after an upgrade with respect to an energy consumer. For example, when installing a new lighting system with a higher energy efficiency, an administrator should be able to observe that the true energy consumption of the monitored site should fall below the previously predicted energy consumption and quantify the amount of savings realized in practice. Such information may also be used for so called energy management contracts (EMC), wherein forecasted savings may be useful for obtaining third party funding for energy saving projects.

Moreover, by means of live or near-live monitoring, automated alarms can be generated, if agreed energy performance targets are not likely to be met. Thus, energy effective management can be enforced by a site manager.

Based on the regression model, deciders will be able to simulate future energy consumption based on changing weather trends, thus helping to quantify the cost of climate change, ultimately supporting the cause for a more sustainable management of energy resources.

What is claimed is:

1. A prediction system comprising:
    a measurement system comprising a plurality of sensors, the plurality of sensors configured to measure and provide a time series of granular-level consumption data;
    a first data decomposition facility configured to decompose the time series of granular-level consumption data into three different training sets for working days, weekend days and holidays, respectively;
    a second data decomposition facility configured to decompose each one of the three different training sets into a seasonal component and a trend component;
    a regression facility configured to perform a regression analysis on the trend component based on chronological information associated with the consumption data of the respective training set to train a prediction function; and
    a prediction facility configured to estimate predicted energy consumption data based on the trained prediction function and a type of a day for which the prediction is performed.

2. The prediction system according to claim 1, further comprising a data capture facility configured to capture granular-level consumption data of a monitored site.

3. The prediction system according to claim 2, wherein the first decomposition facility is configured to decompose granular-level consumption data captured by the data capture facility.

4. The prediction system according to claim 2, further comprising a comparison facility configured to compare captured granular-level consumption data of the monitored site with the estimated energy consumption data.

5. The prediction system according to claim 4, further comprising a graphical user interface configured to display the captured granular-level consumption data of the monitored site and the estimated energy consumption data.

6. The prediction system according to claim 4, further comprising an alerting facility configured to notify an user, if the captured granular-level consumption data exceeds the predicted energy consumption data by more than a predefined margin.

7. The prediction system according to claim 1, further comprising a data storage facility configured to store at least one the time series of consumption data, the three different training sets, the seasonal component, the trend component, the prediction function and the predicted energy consumption data.

8. A method for predicting energy consumption data comprising:
    capturing consumption data of energy consumed using a measurement system, wherein the energy consumption data comprises a time series of granular-level consumption data;
    decomposing the consumption data into a plurality of different training sets for working days, weekend days and holidays;

training a prediction function independently for each type of day based on a corresponding training set of the plurality of training sets; and estimating predicted energy consumption data based on the trained prediction function and a type of the day for which the prediction is performed.

9. The method according to claim 8, wherein, in the step of decomposing the consumption data into a plurality of different training sets, the consumption data is decomposed based on a rule into a sequence of weekdays, a sequence of weekend days and a sequence of holidays.

10. The method according to claim 8, wherein, in the step of decomposing the consumption data into a plurality of different training sets, the consumption data is decomposed into a plurality of sequences of similar days using a machine learning algorithm based on the consumption data.

11. The method according to claim 8, further comprising the step of decomposing each one of the plurality of training sets into a seasonal component, a trend component, and a residual component.

12. The method according to claim 11, wherein, in the step of training the prediction function, a regression analysis is performed on the trend component based on chronological information associated with the consumption data of the respective training set.

13. The method according to claim 12, wherein the regression analysis is further based on environmental information associated with the consumption data of the respective training set.

14. The method according to claim 12, wherein environmental information comprises at least one of temperature data, humidity data, wind data, and UV radiation data.

15. The method according to claim 11, wherein, in the step of training the prediction function, the prediction function is trained based on the following series:

$$f(t) = f_{type}^{seasonal} + f_{type}^{trend}(\theta t, \beta^*_{type})$$

where type is the type of the day t, $\theta_t$ is a set of features of day t and $\beta^*$ is an estimated optimal parameter.

16. The method according to claim 15, wherein the set of features of day t comprises at least one of a heating degree day parameter and a cooling degree day parameter for day t.

17. The method according to claim 8, wherein granular-level consumption data is provided for at least one energy resource type.

18. The method according to claim 8, wherein the time series of consumption data comprise consumption data for at least one of electrical energy, gas, oil, hot water and steam.

19. A cloud-based prediction platform comprising:
a measurement system comprising a plurality of sensors, and configured to measure a time series of granular-level consumption data; and
a processor comprising a non-transitory storage medium storing instructions to be executed on the processor, the instructions configured to
capture the time series of granular-level consumption data provided over a data network;
decompose the consumption data into a three different training sets for working days, weekend days and holidays, respectively;
decompose each one of the three training sets into at least a seasonal component and a trend component;
perform a regression analysis on the the trend component based on chronological information associated with the consumption data of the respective training set to train a prediction function;
estimate predicted energy consumption data based on the trained prediction function and a type of a day for which the prediction is performed; and
output the estimated predicted energy consumption data to at least one of a user interface display, an alerting facility, a storage facility or a third party interface.

20. The prediction system of claim 1, wherein the measurement system comprises a plurality of sensors, wherein the sensors are placed on corresponding circuit-breakers, each circuit-breaker protecting a corresponding circuit leading to electrical consumers within a site to be monitored, each sensor monitoring an energy consumption of a circuit protected by a corresponding circuit breaker to which the sensor is assigned.

* * * * *